United States Patent
Blaszczak et al.

(10) Patent No.: US 7,034,383 B2
(45) Date of Patent: Apr. 25, 2006

(54) ELECTRONIC COMPONENT AND PANEL AND METHOD FOR PRODUCING THE SAME

(75) Inventors: Stephan Blaszczak, Freyburg (DE); Martin Reiss, Medingen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/501,599

(22) PCT Filed: Jan. 14, 2003

(86) PCT No.: PCT/DE03/00083

§ 371 (c)(1),
(2), (4) Date: Dec. 22, 2004

(87) PCT Pub. No.: WO03/060999

PCT Pub. Date: Jul. 24, 2003

(65) Prior Publication Data

US 2005/0087889 A1     Apr. 28, 2005

(30) Foreign Application Priority Data

Jan. 17, 2002     (DE) ............................... 102 01 775

(51) Int. Cl.
*H01L 23/02* (2006.01)
(52) U.S. Cl. .............. 257/678; 257/683; 257/685; 257/787
(58) Field of Classification Search ............ 257/680, 257/778, 787
See application file for complete search history.

(56) References Cited

U.S. PATENT DOCUMENTS

| | | | |
|---|---|---|---|
| 5,814,882 A * | 9/1998 | Shimada et al. | 257/704 |
| 6,048,755 A | 4/2000 | Jiang et al. | |
| 6,075,288 A * | 6/2000 | Akram | 257/706 |
| 6,077,757 A | 6/2000 | Mizuno et al. | |
| 6,100,114 A | 8/2000 | Milkovich et al. | |
| 6,207,478 B1 | 3/2001 | Chung et al. | |
| 6,384,473 B1 * | 5/2002 | Peterson et al. | 257/680 |
| 6,486,554 B1 * | 11/2002 | Johnson | 257/738 |
| 6,495,895 B1 * | 12/2002 | Peterson et al. | 257/434 |
| 6,518,089 B1 * | 2/2003 | Coyle | 438/106 |
| 6,809,413 B1 * | 10/2004 | Peterson et al. | 257/680 |
| 2001/0018229 A1 | 8/2001 | Kato et al. | |

FOREIGN PATENT DOCUMENTS

JP     2000299341     10/2000

* cited by examiner

*Primary Examiner*—Thao P. Le
(74) *Attorney, Agent, or Firm*—Dicke, Billig & Czaja, PLLC

(57) ABSTRACT

The invention relates to an electronic component and a panel, the electronic component having a semiconductor chip with a wiring board and a plastic package. The plastic package is made up of two layers of plastic package molding compound arranged one on top of the other. These layers are created with the aid of a printing operation under normal atmosphere.

14 Claims, 2 Drawing Sheets

ND METHOD FOR PRODUCING THE
ELECTRONIC COMPONENT AND PANEL AND METHOD FOR PRODUCING THE SAME

CROSS REFERENCE TO RELATED APPLICATION

This Utility patent application claims the benefit of the filing date of Application No. DE 102 01 775.1, filed Jan. 17, 2002 and International Application No. PCT/DE03/00083, filed Jan. 14, 2003, both of which are herein incorporated by reference.

BACKGROUND

The invention relates to an electronic component and a panel and to a method for producing the same.

Electronic components that have a semiconductor chip and a wiring board arranged on the upper side of the semiconductor chip already form with these components the package of the electronic component. All that is necessary for this purpose is to apply the wiring board to the semiconductor chip with the aid of a double-sided adhesive film. The wiring board carries the external contacts and a patterned metal coating of wiring leads, which lead from the macroscopic output contacts to the microscopically small contact areas of the upper side of the semiconductor chip in a bonding channel of the wiring board. In this connection, microscopically small is understood as meaning a dimension which lies in the micrometer range, and can consequently only be measured with the aid of an optical microscope, whereas the macroscopic external contacts are understood as meaning dimensions which can be perceived with the naked eye and can be measured with simple instruments.

To protect the sensitive semiconductor chip, the upper side of the wiring board, which is connected to the semiconductor chip, may additionally carry a plastic package molding compound. This plastic package molding compound may either protect the edges of the semiconductor chip or completely surround the semiconductor chip, as known from the patent U.S. Pat. No. 6,048,755 for BGA packages (ball grid array packages). For applying such protective plastic package molding compounds to the upper side of the wiring board and for encapsulating the semiconductor chip, either high-pressure injection-molding processes may be used, operating at working pressures of over 100 bar in order to avoid inclusions of air bubbles in the plastic package molding compound, or vacuum printing installations may be used, to ensure back-side protection of the semiconductor chips without air bubbles. Since, in vacuum printing installations, the application or printing of the back sides of the wiring board and the filling of the intermediate spaces between the semiconductor chips is performed under a vacuum, with these installations there is no risk of the inclusion of air bubbles since there is no air in the vacuum.

Both methods of protecting the back sides of the semiconductor chips, that is methods which operate under a vacuum or at high pressure, are costly, but result in the semiconductor chip being encapsulated by a single costly method step. In addition, both methods take up relatively large intermediate spaces between a number of semiconductor chips to be packed simultaneously in plastic molding compound, in order to ensure that the plastic package molding compound is reliably introduced around the semiconductor chips without air bubbles. Attempts to provide low-cost methods which permit the plastic package molding compound to be printed onto the back sides and the edge sides of the semiconductor chips in normal air fail because of the inclusions of air bubbles, in particular if the intermediate spaces between a number of semiconductor chips to be packed in plastic package molding compound become ever closer because of increasing density per unit area being worked.

SUMMARY

One embodiment of the invention provides an electronic component and a panel and also a method for producing them. The component has a structure that makes it possible to apply a plastic package molding compound with which the inclusion of air bubbles is reduced. At the same time, the production costs are reduced.

According to one embodiment of the invention, an electronic component with a semiconductor chip, a wiring board and a plastic package is provided. The plastic package has two plastic package molding compounds arranged one on top of the other. One of the plastic package molding compounds forms a first layer, which completely encloses at least the edge regions of the semiconductor chip, and the other of the plastic package molding compounds forms a second layer, which is arranged on the back side of the semiconductor chip.

No mechanically and hygroscopically unstable limit forms at the transition from one plastic molding compound to the other, especially since the properties of the plastic package molding compound in the first layer can be adapted to the complex edge region structure of the semiconductor chip and the second plastic package molding compound is adapted to the requirements of application over the surface area on the back side of the semiconductor chips. By adaptation of the properties of the plastic package molding compound in the first layer, even complicated structures, as occur in the edge region of semiconductor chips, can be provided with plastic without any bubbles. Since a boundary phase is not perceptible with the naked eye, but only apparent under microscopic examination, the external appearance of the electronic component remains unchanged for the user market, although this electronic component is produced at lower cost by much less expensive methods on account of the combination of the plastic package molding compounds and the matching of their properties to one another.

In one embodiment of the invention, the plastic package molding compound of the first layer has in the uncrosslinked state a lower viscosity than the second layer. This has the advantage that the first, low-viscosity layer can be introduced even into narrow intermediate spaces between semiconductor chips of a closely packed leadframe or panel with many component positions in an extremely confined space by a printing technique and without any bubbles.

Since, when the leadframe or panel is divided up into individual components, the sawing track runs within the intermediate spaces, an edge protection for the semiconductor chips is consequently already produced with the first layer that is introduced into the intermediate spaces. Furthermore, it is ensured that the formation of air bubbles is minimized in these edge regions on account of the low viscosity of the first layer of plastic package molding compound in the uncrosslinked state. This first layer of the plastic package molding compound with low viscosity in the uncrosslinked state is so liquid that it wets the edges of the semiconductor chips and, in the case of small intermediate spaces between two semiconductor chips, can be introduced into the intermediate space without any bubbles on account of capillary forces.

In addition, this first layer of the plastic package molding compound with low viscosity in the uncrosslinked state has a surface that is extremely smooth and planar.

Consequently, an almost planar boundary phase can form between the low-viscosity first layer and a high-viscosity second layer. Since all the intermediate spaces between the semiconductor chips on a wiring board are already filled by the first, low-viscosity layer, and differences in height are leveled out, when the second, high-viscosity layer is applied in the uncrosslinked state, an extremely planar and smooth boundary layer can be produced between the two layers without the formation of air inclusions.

In a further embodiment of the invention, the viscosities of the first and second layers in the uncrosslinked state differ in such a way that the viscosity of the first layer is lower by at least an order of magnitude than the viscosity of the second layer. On account of this clear difference in viscosity, the first layer is so liquid that it can penetrate without any problem and without air bubbles into extremely narrow intermediate spaces between semiconductor chips, and can consequently wet the edge regions of the semiconductor chips with any plastic molding compound and protect them in the crosslinked state.

A further aspect of the invention relates to a panel with a number of component positions for electronic components. The panel has a leadframe, which has in each component position a bonding channel opening which is filled with a plastic covering compound. The panel has on the opposite side from the bonding channel a number of spaced-apart semiconductor chips in the component positions. The intermediate spaces of these semiconductor chips are filled with a first layer of plastic package molding compound and the back sides of these semiconductor chips are covered with a second layer of plastic package molding compound. In this case, the plastic package molding compound of the first layer in the uncrosslinked state differs from the plastic package molding compound of the second layer in that the first layer in the uncrosslinked state has a lower viscosity than the second layer.

This construction of the panel allows it to be cast or printed for a number of components simultaneously with a first layer of lower viscosity and then the back sides of the semiconductor chips can be covered with a high-viscosity layer completely and without air bubbles, and at the same time with dimensional stability. Only after both layers have been applied in an uncrosslinked state can there follow a temperature step, in which both plastic package molding compounds, both of the first layer and of the second layer, crosslink while maintaining a boundary phase between the two layers.

This boundary phase is demonstrably evident in microscopically small regions, both on the panel and on the individual electronic component, from micrographs of the plastic package molding compound. In this connection, microscopically small is understood as meaning a scale which lies in the micrometer range, dimensions only being ascertainable under an optical microscope.

The viscosities of the first layer and of the second layer of the panel differ by at least an order of magnitude, so that the first layer can fill the intermediate spaces between the semiconductor chips of a panel without any bubbles even when there is extremely dense packing of the panel. With a high-viscosity second layer, which then finds a relatively planar boundary area or surface, a further and dimensionally stable plastic package molding compound can be applied by a printing technique without any air bubbles. The advantage of such a panel is that, for a number of components at the same time, a plastic package molding compound comprises two components, that is a low-viscosity component and a high-viscosity component, which form a plastic package without any air bubbles.

One method for producing the panel from a leadframe for a number of electronic components in corresponding component positions with semiconductor chip, which are encapsulated by two layers of a plastic package molding compound, has the following method steps:

provision of a leadframe with a number of component positions which have a bonding channel opening at their center, application of a double-sided adhesive film with a bonding channel opening in the component positions, application of semiconductor chips with their active upper sides to the double-sided adhesive film, introduction of bonding connections in every bonding channel for electrically connecting contact areas of the semiconductor chip to external contacts on the underside of the leadframe, filling of the bonding channel with a plastic covering compound, printing of a first layer of low-viscosity plastic package molding compound onto the back sides of the semiconductor chips for filling the intermediate spaces between the semiconductor chips on the leadframe, printing on of a second layer of high-viscosity plastic package molding compound for covering the back sides of the semiconductor chips, curing of the plastic package molding compound to form a closed upper side of the panel with the formation of a boundary phase, application of external contacts to the underside of the panel.

With this method, many steps on the way to producing an electronic component can be carried out in parallel for a number of electronic components.

In addition, with this method the intermediate spaces between the semiconductor chips, and consequently the packing density of the semiconductor chips on the leadframe of the panel, can be made to be extremely close, since no evacuation of the intermediate spaces between the semiconductor chips is required, but rather the low-viscosity component of the first layer in the uncured state can fill the intermediate spaces between the semiconductor chips without any bubbles by means of capillary action.

Furthermore, with the first low-viscosity layer, an extremely planar boundary phase can be built up between the first layer and the second layer, so that when the high-viscosity layer is applied no air bubbles are introduced into the boundary layer between the low-viscosity layer and the high-viscosity layer. The curing of the two plastic package molding compounds of the first layer and of the second layer can take place simultaneously in an annealing oven, so that a closed smooth and planar upper side of the panel is produced. Application of external contacts to the underside of the panel on each of the external contact areas of the underside of the leadframe provides that a high number of external contacts can be soldered in on the underside of the leadframe at the same time and by one step.

In an example of how the method of the invention is carried out, the printing on of the first and second layers of low-viscosity and high-viscosity plastic package molding compound takes place by means of screen printing. For this purpose, a screen which has an opening of the same size as the entire panel is placed onto the leadframe and a low-viscosity plastic package molding compound is introduced and distributed with the aid of a spatula. In this case, the plastic package molding compound is introduced into the intermediate spaces between the semiconductor chips partly by means of capillary forces, without the formation of air bubble inclusions.

Both when printing on the first layer of low-viscosity plastic package molding compound and when printing on the second layer of high-viscosity plastic package molding compound, a spatula is used, and is pressed onto the printing screen under pressure in order to produce the most uniform and planar outer surfaces possible of the electronic component or outer surfaces of the package of the electronic component.

In a further example of how the method is carried out, the second layer of plastic package molding compound, which is applied to the back sides of the semiconductor chips, may be applied with the same printing screen as the first layer of plastic package molding compound. These method steps create a panel for a number of electronic components, which has a complete plastic package of plastic package molding compound on one side, this package comprising two layers lying one on top of the other which are introduced in an advantageous way without any air bubbles, because the first layer consists of a low-viscosity plastic package material and the second layer is made up of a high-viscosity material. The high-viscosity covering of the back sides of the electronic semiconductor chips at the same time brings about the effect that the planar surface which is produced by a screen during the printing operation can be retained in a dimensionally stable form during the entire process phases, in particular also during the curing process.

A method for producing an electronic component from the panel merely has one further step to follow, that is dividing up the panel into individual electronic components. For this purpose, a saw is used to divide up the panel through the intermediate spaces, which are in the meantime filled with low-viscosity plastic, so that, if the external contacts have already been applied to the panel in advance, a complete electronic component is provided, for attachment to a higher-level circuit structure such as a printed circuit board. One advantage of this method is that it is possible to dispense with expensive vacuum printing installations and expensive high-pressure injection-molding installations for the method according to the invention.

To sum up, it can be stated that the filling of the leadframe with a plastic package molding compound to form a panel for a number of electronic components can take place by coating or printing the lower-lying regions between the chips with a low-viscosity and non-bubble-forming plastic package molding compound and subsequently overprinting the entire panel with a high-viscosity plastic. This overprinting makes it possible for the individual semiconductor chips within the panel to be encapsulated without any bubbles.

The low-viscosity encapsulating compound or plastic package molding compound that is applied first may already be cured, or else be overprinted with a high-viscosity encapsulating compound while in the not yet cured state. The method has the consequence that it is possible to dispense with the vacuum process steps that are otherwise required in the case of vacuum printing. Furthermore, for methods which provide degassing of the plastic package molding compound, the slower multiple printing and the slower degassing in a vacuum can be replaced by the faster printing processes with low-viscosity material and with subsequent high-viscosity material.

The spacing limitation required for the evacuation of the intermediate spaces that has to be observed in the case of the vacuum printing method is also no longer needed, so that a certain gain in surface area is made possible by closer packing of the leadframe with semiconductor chips. The sinking of the encapsulating compound when it is applied by only one method step can also be prevented by this two-stage method. One embodiment of the invention utilizes a combination of low-viscosity and high-viscosity plastic package molding compounds in order to ensure bubble-free printing of plastic packages on semiconductor chips by means of a multistage process.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
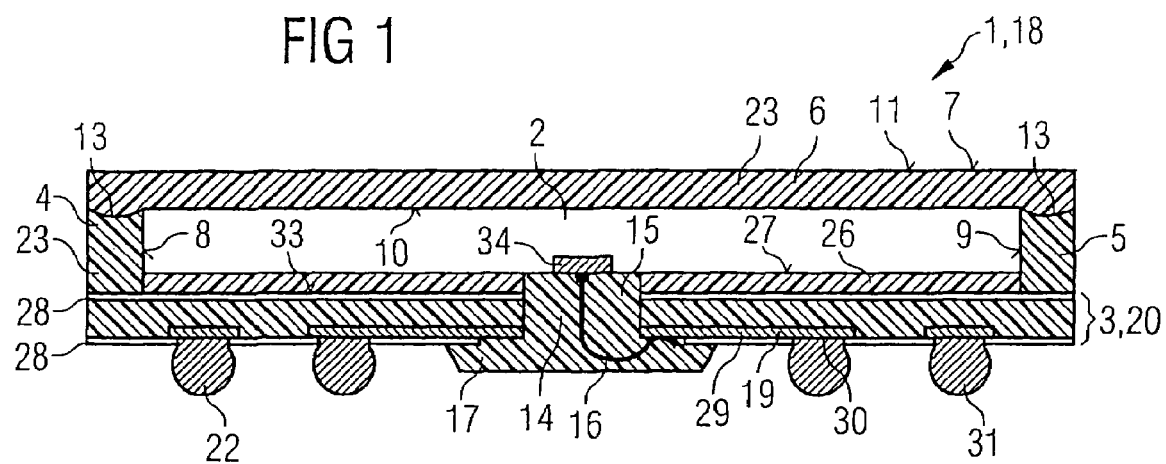
FIG. 1 illustrates a schematic cross-sectional view of an electronic component of a component position of a panel of an embodiment of the invention.

FIG. 1 illustrates a schematic cross-sectional view of an electronic component 1 of a component position 18 of a panel 36 of an embodiment of the invention. The reference numeral 2 identifies a semiconductor chip, which is connected by its active upper side 27 on a wiring board 3 by means of a double-sided adhesive film 26. The reference numeral 4 identifies a plastic package, which is made up of a first layer 5 of a plastic package molding compound 23 and a second layer 6 of a plastic package molding compound 23. Between the plastic package molding compounds 23, or between the first and second layers 5 and 6, there forms a boundary phase 13, which is demonstrably evident under a microscope both for the electronic component 1 and for the panel 36.

The reference numeral 7 identifies the outer sides of the plastic package 4, which in the case of this embodiment of the invention, which constructs a plastic package 4 by means of a printing technique, does not substantially differ significantly from plastic packages 4 that have been produced by means of high-pressure injection-molding processes or by means of vacuum printing processes.

In the case of the high-pressure process, such a high pressure is exerted on the plastic package molding compound that air bubbles are pressed out of the assembly, whereas in the case of the vacuum printing process air bubbles cannot occur for the very reason that the entire printing is carried out in a vacuum chamber.

The reference numerals 8 and 9 identify the edge regions of the semiconductor chip 2, which are enclosed at least by the first layer 5 of plastic package molding compound 23. The reference numeral 10 identifies the back side of the semiconductor chips 2 or the semiconductor chip 2, which is completely covered with plastic package molding compound 23, the greatest proportion of this plastic package molding compound 23 being provided by a high-viscosity plastic molding compound, which is applied in a second step to the back sides 10 of the semiconductor chips 2, to form a second layer 6. The reference numeral 11 identifies a closed upper side of the panel 36, which is substantially the upper side of the plastic package molding compound 23 of the second layer 6.

With the reference numeral 12, the intermediate spaces between the semiconductor chips 2 of a panel 36 are identified. These intermediate spaces 12 may be made extremely narrow, since the low-viscosity plastic package molding compound 23 in the uncrosslinked state can penetrate into very narrow intermediate spaces 12 by means of capillary action. In this way, the packing density of the semiconductor chips 2 on a leadframe 20 can be increased and improved. The reference numeral 13 identifies the boundary phase, already mentioned above, between the first, low-viscosity layer 5 and the second, high-viscosity layer 6 of plastic package molding compound 23.

Arranged on the underside 21 of the leadframe 20, opposite from the plastic package molding compound 23, is a bonding opening 14 for a bonding channel 15. This bonding channel 15 allows the microscopically small contact areas 34 of the semiconductor chip 2 to be connected to the macroscopic external contacts 30 on the wiring board 3. For this purpose, bonding connections 16 are arranged between the contact areas 34 of the semiconductor chip 2 and the wiring leads 19 on the underside of the leadframe 20. The wiring leads 19 extend from the bonding channel 15 to external contact areas 30 on the underside of the wiring board 3. These external contact areas 30 carry external contacts 22, which are arranged on the external contact areas 30 on the underside 21 of the leadframe 20.

At the transitions of the bonding connections 16 to the wiring leads 19, they have bonding ends or bonding fingers. These bonding ends may be improved by a coating. Since the wiring leads 19 substantially comprise a copper layer, a copper-diffusion-inhibiting metal and a precious metal arranged on top of the latter may be provided for the improvement. The copper-diffusion-inhibiting metal may be nickel or alloys of the same, since copper cannot diffuse through this nickel layer. The precious metal layer may consist of gold, silver or alloys of the same and provides frictionless bonding. By applying a flux to the external contact areas 30, external contacts can also be soldered onto the external contact areas 30.

The sensitive bonding connections 16 may be protected by filling the bonding channel 15 with a plastic covering compound 17. In this case, the height of the plastic covering compound 17 is less than the height by which the external contacts protrude from the underside of the wiring board 3 or the underside 21 of the leadframe 20. The leadframe 20 itself, which has a number of component positions 18, comprises a core plate 32, which for its part consists of glass fiber reinforced epoxy resin.

As illustrated in FIG. 1, the electronic component 1 has a bubble-free plastic package molding compound 23 on the semiconductor chips 2, since an inclusion of air bubbles is prevented in principle by the multistage application of the plastic package molding compound 23 in the form of a first, low-viscosity package molding compound and a high-viscosity package molding compound applied on top of the latter.

In one embodiment, the difference in viscosity between the first layer 5 of plastic package molding compound 23 and the second layer 6 of plastic package molding compound 23 is at least an order of magnitude. This ensures that the first layer 5 of plastic package molding compound 23 can be introduced into the intermediate spaces 12 between the semiconductor chips 2 without bubbles, so that the edge regions 8 and 9 of the semiconductor chip 2 are protected by a plastic package molding compound 23 surrounding them. The second, high-viscosity layer 6 substantially covers the back sides 10 of the semiconductor chips 2, so that complete encapsulation of the semiconductor chips 2 is ensured by this embodiment of the invention.

Figure 2:
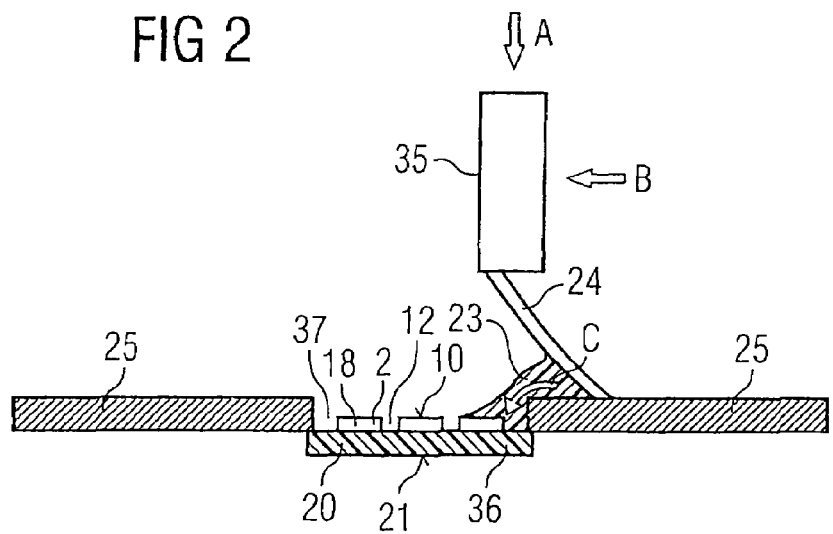
FIG. 2 illustrates a basic diagram of a device for applying a first layer of a plastic package molding compound for a panel.

FIG. 2 illustrates a basic diagram of a device for applying a first layer 5 of a plastic package molding compound 23 to a panel 36. Components with the same functions as in FIG. 1 are identified by the same reference numerals and are not explained separately.

The device, as illustrated in principle in FIG. 2, has a screen 25, which leaves a screen opening 37 over the semiconductor chips 2. A spatula 24 is moved in the direction B over the screen 25 and thereby spreads a first, low-viscosity plastic package molding compound onto the opening 37 in the screen. This low-viscosity material distributes itself in the intermediate spaces 12 between the semiconductor chips 2. Since these intermediate spaces 12 can be extremely small, the filling of the intermediate spaces may, given an appropriately low viscosity, be assisted by capillary action, by which the first plastic package molding compound 23 penetrates into the intermediate spaces between the semiconductor chips 2 without any bubbles.

At the same time, a pressure is exerted in the direction of the arrow A on the spatula 24, which is arranged in a mount 35, in order that the opening 37 in the screen 25 can be filled completely with the plastic package molding compound of the first layer. At the same time, part of the back sides 10 of the semiconductor chips 2 may also be printed with the low-viscosity plastic package molding compound 23.

Figure 3:
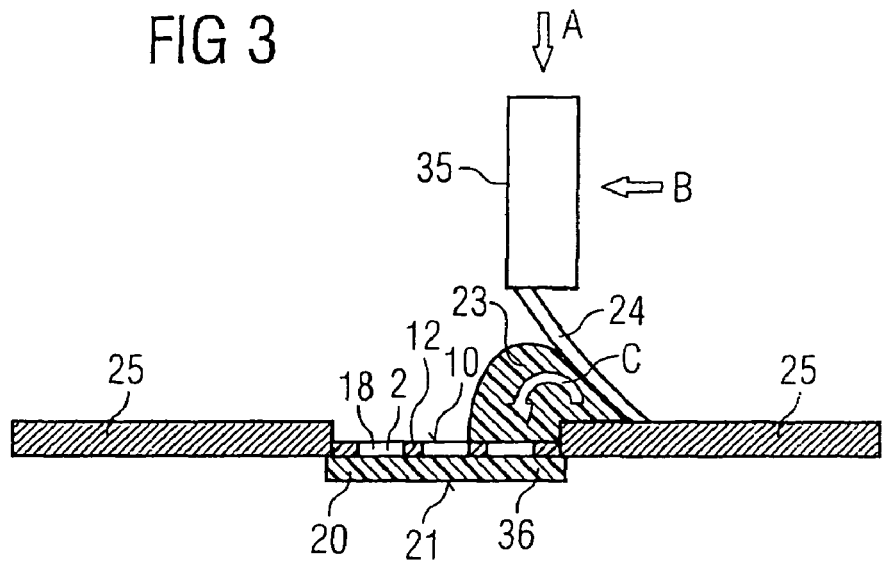
FIG. 3 illustrates a basic diagram of a device for applying a second layer of a plastic package molding compound for a panel.

FIG. 3 illustrates a basic diagram of a device for applying a second layer 6 of a plastic package molding compound 23 for a panel 36. Components with the same functions as in the preceding figures are identified by the same reference numerals and are not explained separately.

When this device is used, the intermediate spaces 12 are already filled and a spatula 24 is then moved in the direction of the arrow B, at the same time pushing a bead of high-viscosity plastic package molding compound 23 in front of it, and consequently printing a covering onto the back sides 10 of the semiconductor chips 2 in the component positions 18. This high-viscosity plastic package molding compound 23 can be applied without any bubbles, because the first layer forms an extremely planar surface as a boundary phase.

Figure 4:
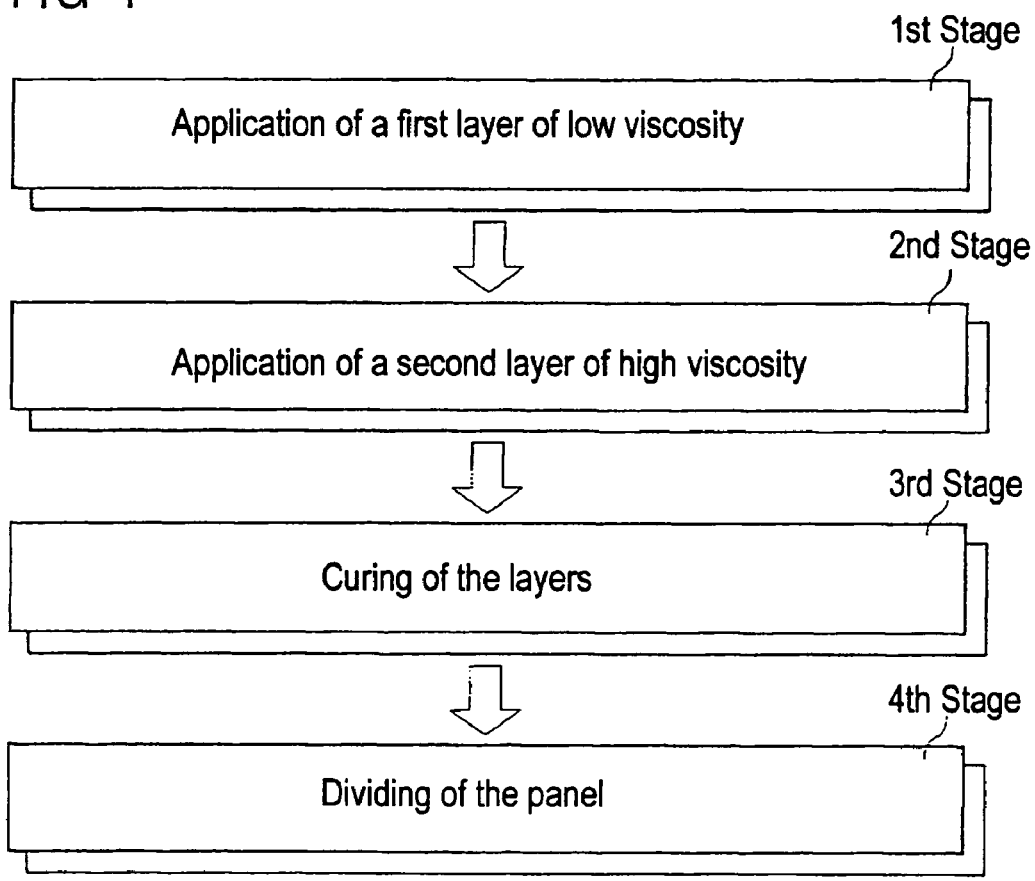
FIG. 4 illustrates an extract from a flow diagram for the step-by-step production of a plastic package molding compound on a panel for a number of electronic components.

FIG. 4 illustrates an extract from a flow diagram for producing a plastic package molding compound 23 on a panel 36 for a number of electronic components 1. The flow diagram comprises in the first stage the printing of the opening in the screen, and consequently the printing of the semiconductor chips with a low-viscosity plastic package molding compound. This low-viscosity plastic package material will become lodged in the intermediate spaces between the semiconductor chips of a panel, without air bubble inclusions occurring.

In the second stage, there is then carried out a second printing operation, in which a high-viscosity plastic package molding compound is pressed into the opening of the screen with the aid of the spatula, while applying a pressure in the direction of the arrow A to the device illustrated in FIG. 3.

In the third stage, the plastic is cured with the aid of thermal steps. For this purpose, the low-viscosity, first layer may have already been cured in advance, so that in the third stage the high-viscosity component is crosslinked.

The fourth stage comprises the dividing up of the panel into individual electronic components.

The invention claimed is:

1. An electronic component comprising:
   a semiconductor chip having edge regions and a back side;
   a wiring board; and
   a plastic package having first and second plastic package molding compounds arranged one on top of the other, wherein the first plastic package molding compound completely encloses at least the edge regions of the semiconductor chip as a first layer and the second plastic package molding compound is arranged on the back side of the semiconductor chip as a second layer.

2. The electronic component of claim 1, wherein the first plastic package molding compound of the first layer in an uncrosslinked state has a lower viscosity than the second layer.

3. The electronic component of claim 1, wherein the viscosities of the first and second layers in an uncrosslinked state differ in such a way that the viscosity of the first layer is lower by at least an order of magnitude than the viscosity of the second layer.

4. The electronic component of claim 1, wherein the first plastic package molding compound is adapted to application at the edge regions of the semiconductor chip.

5. The electronic component of claim 1, wherein the second plastic package molding compound is adapted to application over the back side of the semiconductor chip.

6. The electronic component of claim 1, wherein the first and second layers are produced by means of high-pressure injection-molding processes.

7. The electronic component of claim 1, wherein the first and second layers are produced by means of vacuum printing processes.

8. A panel with a number of component positions for electronic components comprising:
   a leadframe which has in each component position a bonding channel opening that is filled with a plastic covering compound; and
   a number of semiconductor chips each with back sides and with intermediate spaces between them, wherein the intermediate spaces are filled with a first layer of plastic package molding compound and the back sides are covered with a second layer of plastic package molding compound.

9. The panel of claim 8, wherein the plastic package molding compound of the first layer in an uncrosslinked state has a lower viscosity than the second layer.

10. The panel of claim 8, wherein the viscosities of the first and second layers in an uncrosslinked state differ in such a way that the viscosity of the first layer is lower by at least an order of magnitude than the viscosity of the second layer.

11. The panel of claim 8, wherein the plastic package molding compound of the first layer is adapted to application in the intermediate spaces.

12. The panel of claim 8, wherein the plastic package molding compound of the second layer is adapted to application over the back sides.

13. The panel of claim 8, wherein the first and second layers are produced by means of high-pressure injection-molding processes.

14. The panel of claim 8, wherein the first and second layers are produced by means of vacuum printing processes.

* * * * *